United States Patent [19]

Dhong et al.

[11] Patent Number: 5,343,092
[45] Date of Patent: Aug. 30, 1994

[54] SELF-BIASED FEEDBACK-CONTROLLED ACTIVE PULL-DOWN SIGNAL SWITCHING

[75] Inventors: Sang H. Dhong; Hyun J. Shin, both of Mahopac, N.Y.

[73] Assignee: International Business Machines Corporation, Armonk, N.Y.

[21] Appl. No.: 874,784

[22] Filed: Apr. 27, 1992

[51] Int. Cl.⁵ .................... H03K 17/16; H03K 5/08
[52] U.S. Cl. .................... 307/455; 307/443; 307/563; 307/300
[58] Field of Search .......... 307/455, 443, 446, 300, 307/559, 562–565, 567

[56] References Cited

U.S. PATENT DOCUMENTS

| | | | |
|---|---|---|---|
| 4,065,728 | 12/1977 | Saari | 331/75 |
| 4,531,067 | 7/1985 | Banker et al. | 307/454 |
| 4,559,458 | 12/1985 | MA | 307/455 |
| 4,603,268 | 7/1986 | Davis | 307/559 |
| 4,661,727 | 4/1987 | Ferris et al. | 307/456 |
| 4,687,953 | 9/1987 | Varadarjan | 307/455 |
| 4,716,310 | 12/1987 | Tanizawa | 307/446 |
| 4,841,172 | 6/1989 | Ueno et al. | 307/443 |
| 4,877,975 | 10/1989 | Ueno | 307/443 |
| 4,877,977 | 10/1989 | Kokado | 307/455 |
| 4,988,898 | 1/1991 | Jansson | 307/475 |
| 5,003,199 | 3/1991 | Chuang et al. | 307/446 |

FOREIGN PATENT DOCUMENTS

0424589A1 5/1991 European Pat. Off. .

OTHER PUBLICATIONS

Chuang, K., "High-Speed/Low-Power Charge-Buffered Active-Pull-Down ECL/NTL Circuits," *IBM Technical Disclosure Bulletin*, vol. 33, No. 1A, pp. 470–472, Jun. 1990.

Chuang, C. K. and Toh, K. Y., "High-Speed ECL Circuit," *IBM Technical Disclosure Bulletin*, vol. 32, No. 4A, pp. 374–380, Sep. 1989.

Coy, B., Mai, A., and Yuen, R., "A 13,000 Gate 3 Layer Metal Bipolar Gate Array," IEEE 1988 Custom Integrated Circuits Conference, 20.1.1–20.1.3.

Primary Examiner—Edward P. Westin
Assistant Examiner—Andrew Sanders
Attorney, Agent, or Firm—Heslin & Rothenberg

[57] ABSTRACT

High speed, low power signal switching logic implementable in bipolar or BiCMOS technology is described. Signal switching is between a first prescribed state and a second prescribed state and is accomplished using a conventional active signal pull-up circuit in combination with a novel self-biased, feedback-controlled active signal pull-down circuit. The active signal pull-down circuit is driven by a feedback signal obtained from the active pull-up circuitry such that only a single input connection to the signal switching circuit is required. Preferably, the active signal pull-up circuit comprises an emitter follower coupled transistor and the drive signal for the active signal pull-down circuit is taken from the collector thereof via a dc-coupling level shifter. Various signal switching circuit embodiments are described.

30 Claims, 3 Drawing Sheets

SELF-BIASED FEEDBACK-CONTROLLED ACTIVE PULL-DOWN SIGNAL SWITCHING

BACKGROUND OF INVENTION

1. Technical Field

The present invention relates in general to logic signal switching devices, and in particular, to bipolar/BiCMOS logic circuits for high speed low power switching of a signal between a first prescribed state and a second prescribed state. Signal switching is accomplished pursuant to the invention using an active signal pull-up circuit in combination with a self-biased, feedback-controlled active signal pull-down circuit.

2. Background Art

In bipolar/BiCMOS digital circuits such as emitter-coupled logic (ECL), non-threshold logic (NTL), and memory circuits, a circuit output stage typically includes pull-up and pull-down signal switching circuits connected in tandem. This tandem connection of circuits is designed to drive a load to a "1" output logic level or to a "0" output logic level based on the output state of an associated logic circuit. Output level switching circuits ideally operate at high speed to establish a corresponding logic "1" or a logic "0" condition for a subsequent semiconductor circuit. Traditional implementations of logic switching circuits with signal pull-up and pull-down functions, typically implement signal pull-up much more rapidly than the pull-down function.

For example, one widely used implementation of a pull-down circuit consists of a resistor, or other current-source pull-down structure, in combination with a standard emitter follower signal pull-up stage to drive the output. Such a signal pull-down approach is referred to as passive pull-down and its primary advantages are simplicity and versatility (e.g., collector-dotting and emitter-dotting are both possible). Unfortunately, a passive pull-down approach fails in contemporary large scale integration implementations where circuits must function at high speed with little power consumption. A principal reason for this is that as consumed power is reduced by minimizing pull-down circuit current, the pull-down switching delay time increases reciprocally, a result obviously counter to high speed signal switching.

As a solution, various active signal pull-down circuits are available for low-power high-speed applications. One particularly popular technique is to set the steady state pull-down current through the inclusion of extra bias circuitry and the utilization of ac (or capacitive) coupling to actively modulate the current in a push-pull manner during input signal transition periods. Pull-down speed is improved by providing a large momentary sink current, while minimizing dc power consumption by setting the steady state current low. Besides the problematic introduction of power supply noise via transient current and circuit complexity, this active pull-down approach restricts the use of emitter-dotting configurations, especially for dc-coupled or complementary push-pull emitter follower circuits. For such circuits, emitter-dotting is simply impractical.

Existing active pull-down emitter follower circuits generally require the addition of an out of phase (complementary) signal for push-pull control. This produces another restriction in that collector-dotting (and even cascoding in some cases) is not allowed, and delay in the preceding logic stage increases through the addition of loading on the out-of-phase signal node. Also, because the push-pull action is input signal driven, transient pull-down current could remain unnecessarily high or low after the output has finished a transition, or could return to a steady state value prematurely before the output circuits complete the transition.

Therefore, a need exists in large scale bipolar/BiCMOS/CMOS logic circuit technology for a signal switching circuit stage having improved performance characteristics over presently available signal switching circuits employing a passive or previously available active signal pull-down approach.

DISCLOSURE OF INVENTION

Briefly summarized, the present invention comprises in one aspect a signal switching circuit for supplying a signal having a prescribed one of two levels corresponding to an associated input signal of a first value or a second value. The high speed, low power consuming signal switching circuit is powered by an on-chip power source. The circuit includes an output terminal which supplies the prescribed signal having the one of two levels and a first transistor means for actively pulling up the prescribed signal at the output terminal in response to a first predefined change in the input signal. The first transistor means includes a first input for receiving the input signal and a second input for coupling to the power source. A second transistor means is provided for actively pulling down the prescribed signal in response to a second predefined change in the input signal to the first transistor means. Further, a self-biased feedback control connecting the first transistor means and the second transistor means is provided so that the two transistor means cooperate to responsively, actively switch the prescribed signal at the output terminal between a high signal level and a low signal level in relation to input signal changes at the first input to the first transistor means.

In a more specific embodiment of the present invention, an emitter coupled logic circuit is provided which includes a bipolar transistor pull-up circuit having a base connected to a previous logic stage circuit and an emitter-collector circuit connected between a circuit output terminal and a first power signal source. The bipolar transistor pull-up circuit provides a first signal level to the output terminal in response to a first logic state applied to the base thereof by the previous logic stage circuit. A bipolar transistor pull-down circuit is also provided, having a base connected to a feedback control circuit which couples the bipolar transistor pull-up and pull-down circuits. The transistor pull-down circuit further has a collector-emitter circuit connected between the output terminal and a second power signal source. The pull-down circuit provides a second signal level at the output terminal in response to a second logic state applied from the previous logic stage circuit to the base of the bipolar transistor pull-up circuit. Thus, during switching of the logic stage circuit output from one logic state to another logic state, the bipolar transistor pull-up circuit and the bipolar pull-down transistor circuit cooperate to actively switch the signal level at the output terminal to the associated one of the first signal level and the second signal level.

In another aspect of the present invention, an active signal pull-down circuit is provided for supplying an output signal having a prescribed low value. The active signal pull-down circuit is to reside within a signal switching circuit which includes a conventional signal pull-up circuit for supplying an output signal having a prescribed high value. The prescribed low value and prescribed high value are each output from the signal switching circuit in response to a corresponding received input signal change at the signal pull-up circuit. The active signal pull-down circuit includes signal pull-down transistor means for actively pulling down the output signal of the switching circuit in response to a second predefined change in the input signal to the active pull-up switching logic circuit. In addition, self-biased, feedback control means couples the signal pull-down transistor means to the signal pull-up circuit for activating the pull-down transistor means upon detection of the second predefined change in the input signal to the signal pull-up circuit.

To summarize, a very efficient, active pull-down, high speed, low power emitter follower circuit is presented herein. The active pull-down circuit may be implemented in bipolar, BiCMOS or CMOS technology. The circuit efficiently merges multiple functions into a minimum number of devices connected in a simple topology. Specifically, a single input from a previous logic block is used to drive a conventional emitter follower (or source follower) active pull-up transistor, which also acts as an inverting amplifier during transition intervals. The active pull-down transistor functions as a constant current source for biasing of the signal switching network and a pull down source for active pull-down. Self-biased feedback control means preferably utilizes a dc-coupled level shifting diode to return, for example, the signal at the collector of the emitter follower transistor in the pull-up circuit to the base of the pull-down circuit transistor. If desired, clamping means can be provided to prevent saturation of the emitter follower coupled transistor.

Again, the push-pull action of the circuit does not require a second input signal and pull-down current is modulated only during the actual transition periods of the output. The circuit is self-biased at constant current and feedback controlled for efficient push-pull operation. Collector dotting and emitter dotting are allowed for improved logic function versus area and power consumption characteristics. The presented circuit is simpler and provides less loading to preceding logic circuits than heretofore known such circuits.

BRIEF DESCRIPTION OF DRAWINGS

These and other objects, advantages and features of the present invention will be more readily understood from the following detailed description of certain preferred embodiments thereof, when considered in conjunction with the accompanying drawings in which.

BEST MODE FOR CARRYING OUT THE INVENTION

Reference now should be made to the accompanying drawings in which the referenced numeric and alphanumeric characters are used throughout the different figures to designate the same or similar components.

Figure 1:
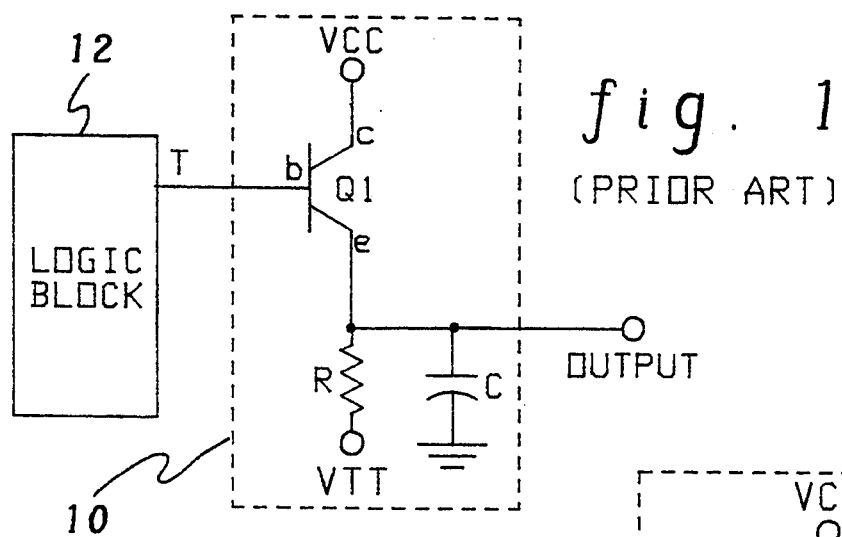
FIG. 1 is a schematic of one prior art embodiment of an emitter follower signal switching circuit.

FIG. 1 depicts a standard emitter-follower signal switching stage 10 which functions as a signal pull-up and signal pull-down output switching circuit for a previous, core logic block 12. Input to circuit 10 is on a "true" line "T" and circuit output comprises either a first signal level (e.g., a logic "1") or a second signal level (e.g., a logic "0") which is used to drive a load or subsequent circuit (not shown) at an output terminal "OUTPUT."

Output signal pull-up is actively accomplished by a bipolar transistor Q1, which has its base "b" tied to line "T", collector "c" connected to a first power supply voltage "VCC", and its emitter "e" tied to circuit 10 output. Thus, for example, when the input signal on line "T" rises, transistor Q1 turns "on" and a voltage equal to the input signal voltage less the base-emitter drop across transistor Q1 is applied to the output terminal of circuit 10. With a lowering input signal transition on line "T", transistor Q1 initially turns "off" and the output signal from circuit 10 is passively dissipated to a low, steady state value. Passive dissipation is through a resistor "R" connected between circuit 10 output and a power sink "VTT" discharging a capacitor "C" connected across circuit 10 output terminal "OUTPUT" and ground. As already noted, this passive signal pull-down approach provides undesirable performance characteristics for present large scale integration circuits due to inherent speed and power consumption limitations. (Consumed power in a passive pull-down circuit such as that represented by circuit 10 can be reduced by minimizing the pull-down current; however, as the pull-down current is minimized the delay time increases reciprocally therewith, thus adversely affecting switching speed.)

Figure 2:
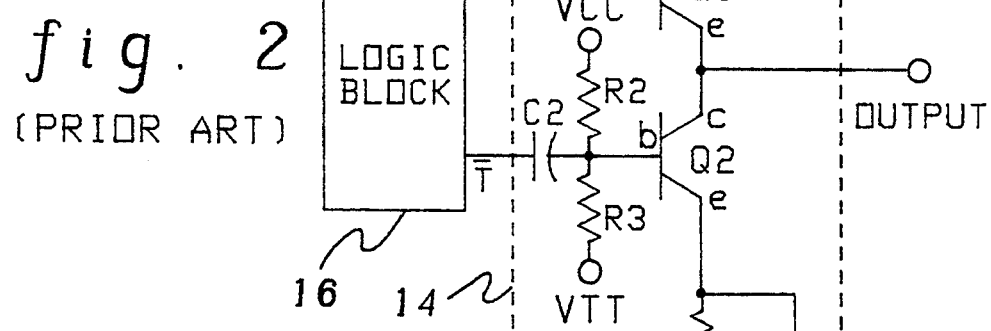
FIG. 2 is a schematic of one prior art embodiment of a two input active pull-up, active pull-down emitter follower signal switching circuit.

FIG. 2 depicts another typical prior art signal switching stage, denoted 14, coupled to a core logic block 16. With this switching stage embodiment, input on "true" line "T" comprises either a first signal level (e.g., a logic "1") or a second signal level (e.g., a logic "0") which is to be applied to a load (not shown) coupled to output terminal "OUTPUT." Again, output signal pull-up is actively accomplished via bipolar transistor Q1, which has its base "b" tied to line "T", collector "c" connected to a first power supply voltage "VCC," and its emitter "e" tied to circuit 10 output. Thus, for example, when the input signal on line "T" rises, transistor Q1 turns "on" and the output is essentially coupled directly to first power supply voltage "VCC".

In contrast to the passive pull-down approach utilized by switching circuit 10 of FIG. 1, output from circuit 14 in FIG. 2 is actively pulled low through the use of a second bipolar transistor Q2. Transistor Q2 has a collector-emitter circuit connected between the output terminal "OUTPUT" and a parallel disposed combination of a resistor "R1" and capacitor "C1", both of which are connected at the other end to a second power supply source "VTT." Transistor Q2 is driven by a complementary signal which must also be provided by logic block 16, via line "T̄". This complementary (or second) input signal to be received on line "T̄" should be exactly 180° out of phase with the "true" signal received on line "T". The complementary signal is received across an RC network comprising a capacitor "C2" and two resistors "R2" & "R3", one end of each of which is connected to line "T̄" and the other end to power supply source "VCC." The active pull-up, active pull-down approach utilized by signal switching logic circuit 14 inherently presents several complications to logic circuit design.

For example, use of an emitter-dotting configuration within the logic block is limited because of the need to supply a complementary signal on line "T̄". For the same reason, collector dotting (and even cascoding in some cases) is not allowed. In addition, loading on the out-of-phase signal node will increase. Also, because the push-pull action of signal switching circuit 14 is driven by two complementary input signals, transient pull-down current could remain unnecessarily high or low after the output has finished a transition, or could return to a steady state value prematurely before the output circuit completes the transition.

Figure 3:
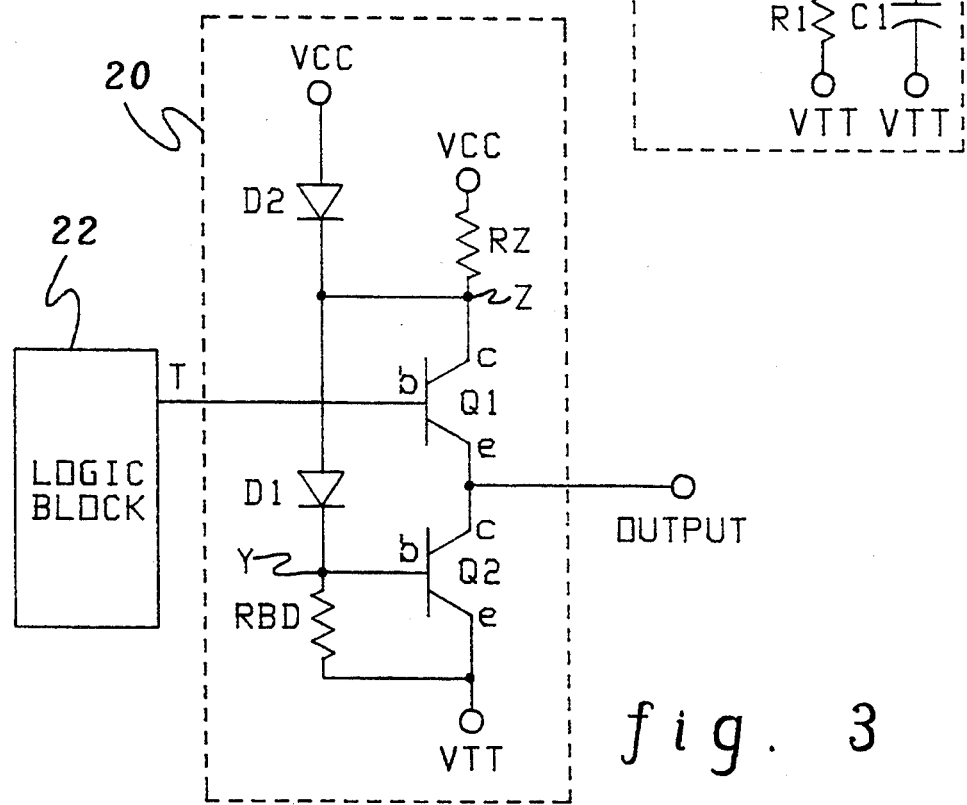
FIG. 3 is a schematic of one bipolar embodiment of a single input, active pull-up, active pull-down signal switching circuit pursuant to the present invention.

One bipolar embodiment of a signal switching circuit, generally denoted 20, pursuant to the present invention is set forth in FIG. 3. Those skilled in the art will note from the following description, that in all embodiments a single input line to the signal switching circuit is utilized, while still providing active pull-up and active pull-down of the output signal during transition periods. This concept avoids a number of the restrictions imposed by prior art active pull-down circuits such as that discussed above with reference to FIG. 2. In the embodiment presented, circuit 20 is coupled to a previous stage logic block 22 via a single input line, again designated "T".

The signal switching circuit also includes an emitter-follower coupled transistor Q1, a current source transistor Q2 for biasing, a level shifting/coupling diode "D1", an optional clamping diode "D2", a current setting resistor "RZ", and a resistor "RBD" for biasing diode "D1". The circuit is powered by a first power level "VCC" and a second power level "VTT", which, for example, may comprise ground potential or a negative voltage level (e.g., −1 volt). Second power level "VTT" functions as a power sink. Again, it is important to note that only one input, i.e., on line "T" from previous logic block 22 is used to drive circuit 20. This single input signal drives both signal switching transition stages because of the use of a feedback control from the active signal pull-up stage to the active signal pull-down stage via diode "D1."

In this new circuit, steady state bias current is self-set at a constant value, assuming that the circuit is designed so that transistors Q1 and Q2 are not saturated for a given termination potential "VTT" and signal swing. Because the potential at node Z can be expressed as VTT+VBE(Q2)+VD(D1) in steady states, the current through resistor RZ is defined by the following ratio:

$$\frac{(VCC - VTT - VBE(Q2) - VD(D1))}{RZ} \quad (1)$$

Wherein:

VBE(Q2)=base to emitter voltage drop of transistor Q2,
VD(D1)=diode voltage drop of diode D1.

Ratio (1) is the sum of the bias current from the emitter follower and the bias current for diode D1, i.e., VBE(Q2)/RBD. Therefore, the bias current for Q1 and Q2 is determined as the following:

$$\frac{(VCC - VTT - VBE(Q2) - VD(D1))}{RZ} - \frac{VBE(Q2)}{RBD} \quad (2)$$

During transient periods, circuit 20 operates as an active pull-down emitter follower with feedback control. For example, when input on line "T" rises from a low to a high signal level, the output at terminal "OUTPUT" follows with a delay. Momentarily, base to emitter voltage drop across transistor Q1 (VBE(Q1)) increases causing the collector current in transistor Q1 to surge and the voltage at node Z to dip. (Should the voltage drop at node Z be too large, then diode D2 can be used to clamp node Z and prevent transistor Q1 from being saturated.) Subsequently, via shifting diode "D1" voltage at node Y dips and the pull-down current in transistor Q2 drops. As a result, the net output charging current increases substantially and the signal at output terminal "OUTPUT" rises faster than that possible with passive pull-down circuits such as FIG. 1. As the output rises to a high state, the base to emitter voltage drop across transistor Q1 (VBE(Q1)) and the collector current through transistor Q1 return to steady state values and the push-pull action gradually ceases.

The more important case is where the input signal on line "T" falls from a high level to a low level. Since the output from circuit 20 follows with a delay, the base to emitter voltage drop across transistor Q1 (VBE(Q1)) decreases for the transition interval, turning transistor Q1 "off" and raising the voltage at node Z. This voltage surge on node Z is coupled to node Y, thereby increasing transistor Q2 current and the net output discharging current dramatically. Thus, the signal output from circuit 20 will fall much faster than the standard signal pull-down approach of FIG. 1, and faster than or at least comparable to the conventional active pull-down circuit of FIG. 2. Once the output signal falls to a low state, the base to emitter voltage across transistor Q1 (VBE(Q1)) and transistor Q1 collector current return to steady state values, and the active pull-down operation ceases.

Again, the push-pull action of the self-biased feedback-controlled signal switching circuit of FIG. 3 requires only a single input signal (i.e., the signal on line "T" from the preceding logic block) and pull-down current is modulated only during the actual transition periods of the output. Those skilled in the art will also note that the depicted feedback-controlled push-pull operation is primarily dc-coupled. However, the operation is additionally capacitive coupled because level shifting diode "D1" is also capacitive in most cases.

Depending upon the termination potential "VTT" chosen and upon signal swing, the shifting voltage drop across diode "D1" (VD(D1)) and clamping voltage drop across diode "D2" (VD(D2)) need to be adjusted to insure that transistor Q1 and transistor Q2 do not become saturated during operation. To accomplish this, a series connection of base-emitter diodes, a diode-voltage multiplier, or a base-collector diode may be used in bipolar technology implementations. Alternatively, in a BiCMOS technology implementation, a MOSFET diode can be used. Another technique to avoiding saturation is to include a resistor "RE" at the transistor Q2 emitter "e" as shown in the signal switching circuit, denoted 24, of FIG. 4. (Circuit 24 is identical to circuit 20 of FIG. 3 with the exception of the emitter resistor "RE.")

Figure 4:
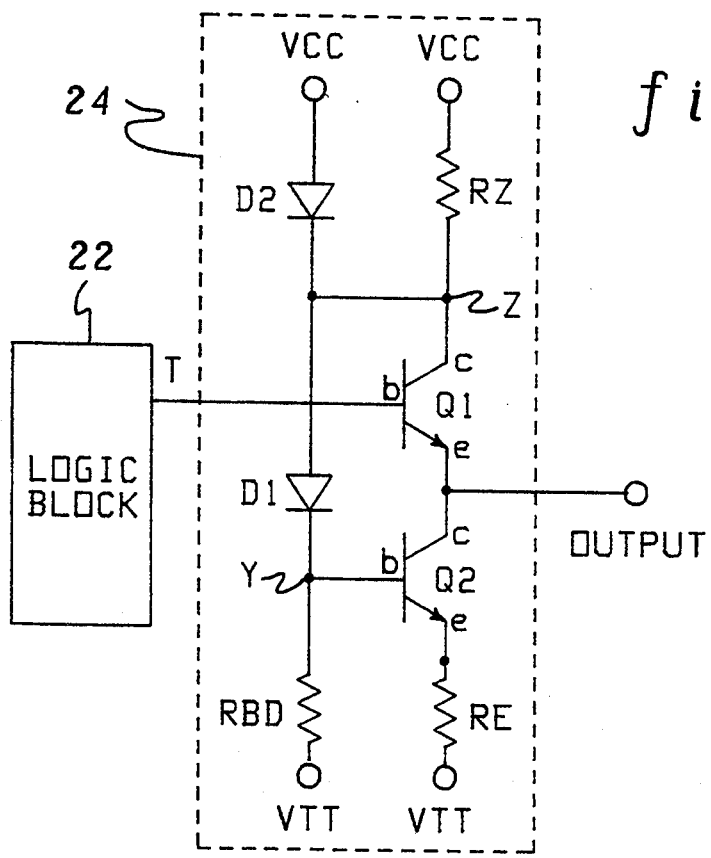
FIG. 4 is a schematic of an alternate bipolar embodiment of a single input, active pull-up, active pull-down signal switching circuit pursuant to the present invention.
Figure 5:
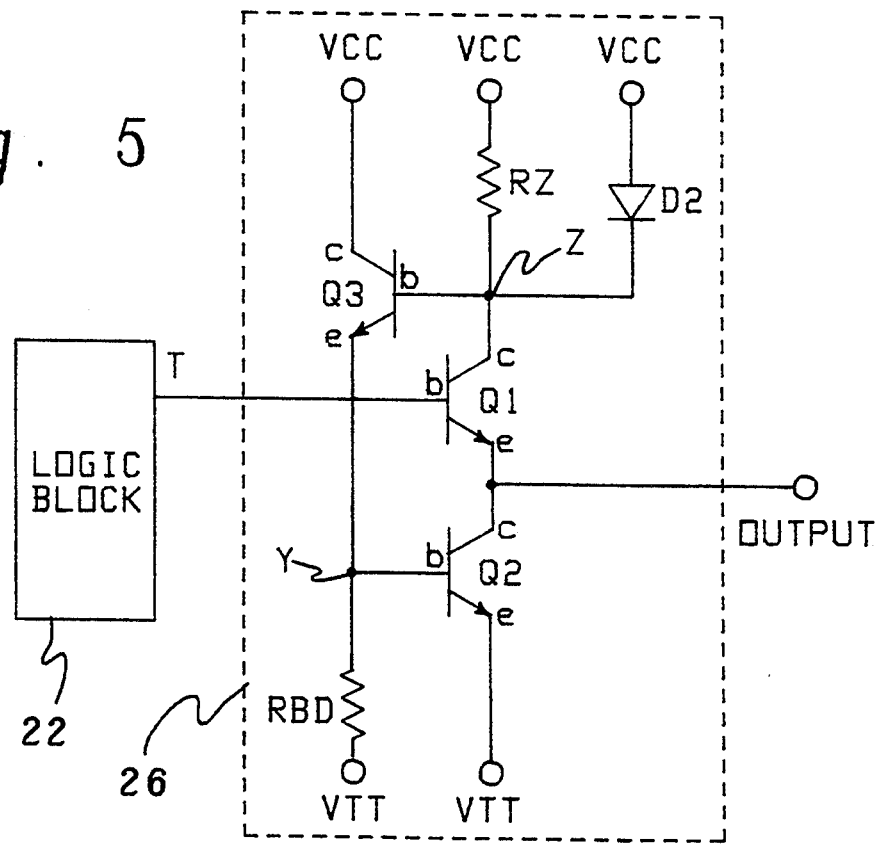
FIG. 5 is a schematic of yet another bipolar embodiment of a single input, active pull-up, active pull-down signal switching circuit pursuant to the present invention.

As with FIG. 4, the signal switching circuit, generally denoted 26, depicted in FIG. 5 is identical to switching circuit 20 of FIG. 3 with one exception, an emitter follower transistor Q3 is substituted for diode "D1." Substitution of transistor Q3 assumes that diode "D1" comprises a shifting diode of a base-emitter diode-type. The base "b" of transistor Q3 is driven by the signal at node Z and the collector "c" is coupled to power supply voltage "VCC" and the emitter "e" is tied to node Y (i.e., the base "b" of transistor Q2). Otherwise, the structure and operation of switching circuit 26 is identical to that of circuit 20 of FIG. 3. However, with circuit 26 (FIG. 5) the parasitic capacitance at node Z is reduced. Further, circuit 26 of FIG. 5 can have separate bias current control and higher feedback control gain.

Figure 6:
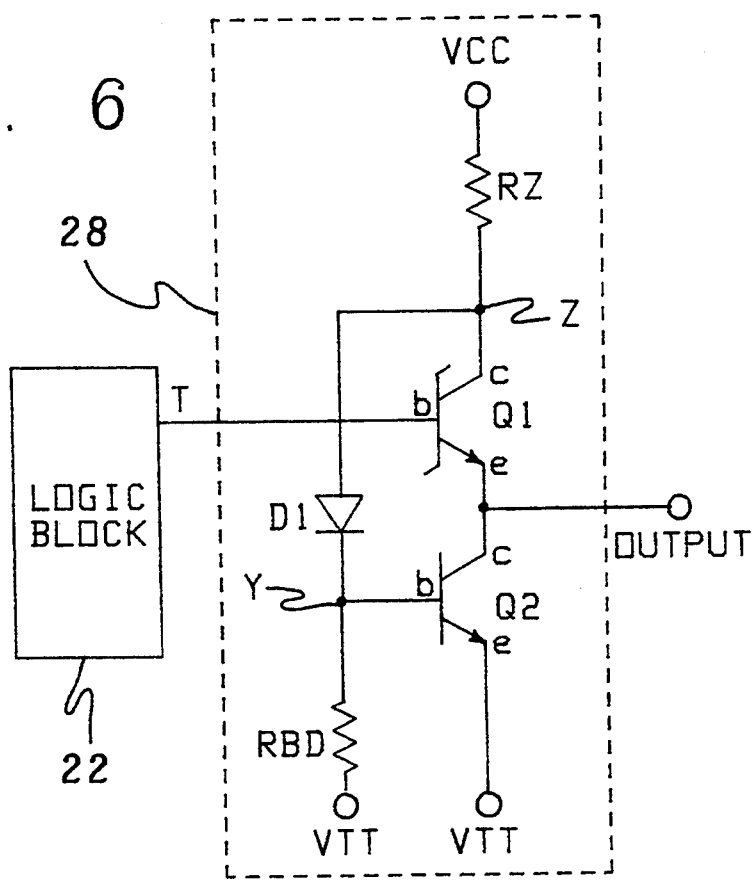
FIG. 6 is a schematic of a further bipolar embodiment of a single input, active pull-up, active pull-down signal switching circuit pursuant to the present invention.

As a further alternative to the signal switching circuit embodiment of FIG. 3, clamping diode "D2" (FIG. 3) can be eliminated by using a diode such as a Schottky diode (or base-collector diode) across the base and collector terminals of transistor Q1 (see signal switching circuit 28 of FIG. 6). However, performance characteristics of circuit 28 (FIG. 6) will be poor in comparison with circuit 20 of FIG. 3. This is because the Schottky diode implementation will increase loading on line "T", which is coupled to preceding logic stage 22.

Figure 7:
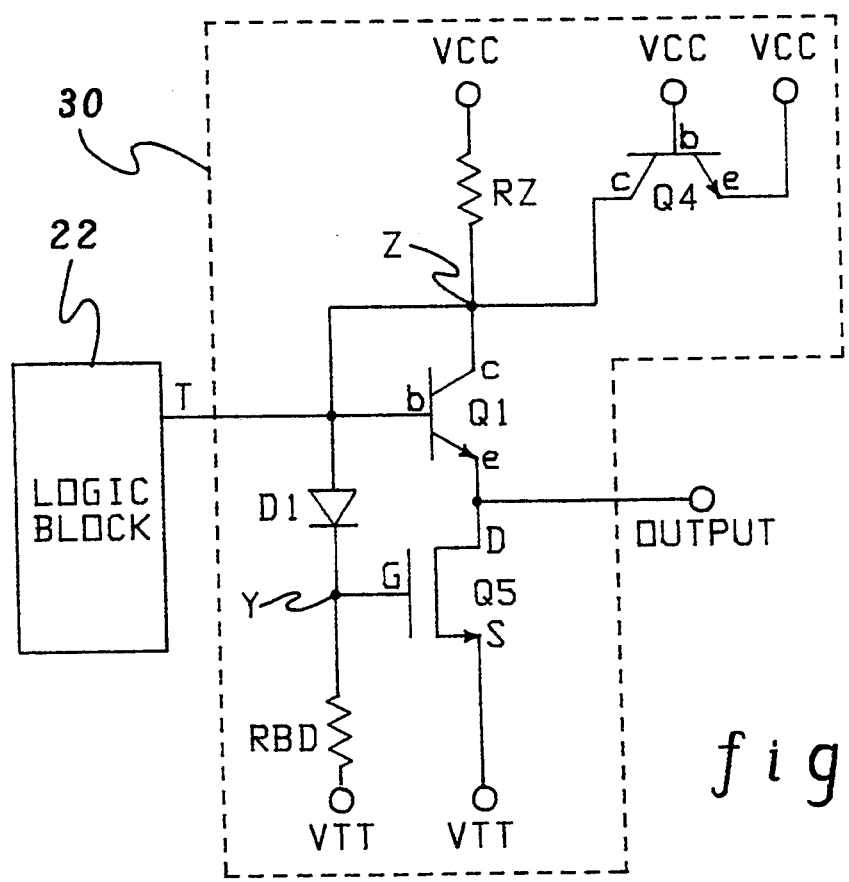
FIG. 7 is a schematic of one BiCMOS embodiment of a single input, active pull-up, active pull-down signal switching circuit pursuant to the present invention.

FIG. 7 depicts one further alternate embodiment of a signal switching circuit, generally denoted 30, pursuant to the present invention. In this BiCMOS implementation, the current source transistor Q2 of FIG. 3 is replaced by an n-channel MOSFET Q5. Additionally, a transistor Q4 is connected in diode configuration between power source "VCC" and node Z to act as a voltage clamp for the emitter follower coupled transistor. Substitution of transistor Q4 (in diode configuration) for diode D2 of FIG. 3 provides slightly different voltage characteristics relevant to initiation of the clamping function.

From the above discussion, it will be recognized that a signal switching circuit pursuant to the present invention can be implemented in either bipolar, BiCMOS or CMOS technology. Further, if implemented in bipolar technology, npn-type transistors can be replaced if desired with pnp-type transistors and if in BiCMOS or CMOS technology, the MOSFETs may be either n-channel-type or p-channel-type. In a CMOS implementation, the basic structure would be source-follower rather than emitter-follower.

In summary, it will be recognized from the above description that a novel signal switching circuit approach is presented herein. Specifically, a very efficient, active pull-down, high speed, low power, emitter follower circuit for bipolar or BiCMOS applications is described. The circuit efficiently merges multiple functions into a minimum number of devices connected in a simple topology.

Specifically, a single input from a previous logic block is used to drive a conventional emitter follower active pull-up transistor, which also acts as an inverting amplifier during transition intervals. The active pull-down transistor functions as a constant current source for biasing of the signal switching network and a pull-down source for active pull-down. Self-biased feedback control means preferably utilizes a dc-coupled level shifting diode to return the signal at the collector of the emitter follower transistor in the pull-up circuit to the base of the pull-down circuit transistor. If desired, clamping means can be provided to prevent saturation of the emitter follower coupled transistor. Again, the push-pull action of the circuit does not require a second input signal and pull-down current is modulated only during the actual transition periods of the output. The circuit is self-biased at constant current and feedback controlled for efficient push-pull operation. Collector dotting and emitter dotting are allowed for improved logic function versus area and power consumption characteristics. The presented circuit is simpler and provides less loading to preceding logic circuits than heretofore known such circuits.

Although a specific embodiment of the present invention has been illustrated in the accompanying drawings and described in the foregoing detailed description, it will be understood that the invention is not limited to the particular embodiments described herein, but is capable of numerous rearrangements, modifications, and substitutions without departing from the scope of the invention. The following claims are intended to encompass all such modifications.

We claim:

1. An emitter coupled logic circuit comprising:
   a bipolar transistor pull-up circuit having a base comprising a single input terminal of the emitter coupled logic circuit connected to a previous logic stage circuit, and having an emitter-collector circuit connected between a circuit output terminal and a first power signal, said bipolar transistor pull-up circuit providing a first signal level to said output terminal in response to a first logic state applied to said single input terminal by said previous logic stage circuit; and
   a bipolar transistor pull-down circuit having a base connected to a feedback control circuit coupling said bipolar transistor pull-up and pull-down circuits such that the collector of said bipolar transistor pull-up circuit and the base of said bipolar transistor pull-down circuit are coupled, said bipolar transistor pull-down circuit further having a collector-emitter circuit connected between said output terminal and a second power signal, said bipolar transistor pull-down circuit providing a second signal level at said output terminal in response to a second logic state applied from said previous logic stage circuit to said single input terminal comprising the base of said bipolar transistor pull-up circuit, whereby during switching of said logic stage circuit output from one of said logic states to the other of said logic states, said bipolar transistor pull-up circuit and said bipolar transistor pull-down circuit cooperate to actively switch the signal level at said output terminal to the associated one of said first signal level and said second signal level.

2. An active signal pull-down circuit for supplying an output signal having a prescribed low value, said active signal pull-down circuit to reside within a signal switching circuit including a signal pull-up circuit for supplying an output signal having a prescribed high value, said prescribed high value signal being output from said signal switching circuit in response to a first predetermined transition in said input signal to said signal pull-up circuit, said active signal pull-down circuit comprising:

signal pull-down transistor means for actively pulling down the output signal of said signal switching circuit in response to a second predefined transition in said input signal to said active signal pull-down circuit; and self-biased feedback control means, including a dc-coupling, level shifting means, coupling said signal pull-down transistor means and said signal pull-down circuit for activating said pull-down transistor means upon initiation of said second predefined transition in said input signal to said signal pull-up circuit, said dc-coupling, level shifting means comprising a level shifting diode.

3. A single switching circuit for supplying a signal having a prescribed one of two levels in response to associated transitions in an input signal between a first value and a second value, said signal switching circuit being powered by a power source, said switching circuit comprising:

an output terminal supplying said prescribed signal having one of two levels;

a bipolar emitter follower coupled transistor for actively pulling-up said prescribed signal at said output terminal in response to a first predefined change in said input signal, said bipolar emitter follower coupled transistor having a first input for receiving said input signal and a second input for coupling to said power source, status of said bipolar emitter follower coupled transistor being controlled by the input signal received at said first input;

a second bipolar transistor for actively pulling down said prescribed signal at said output terminal in response to a second predefined change in said input signal; and feedback control means connecting said bipolar emitter follower coupled transistor and said second bipolar transistor such that the status of said bipolar emitter follower coupled transistor controls said second bipolar transistor, said feedback control means including a dc coupling, level shifting means comprising a level shifting diode coupled between a collector of said bipolar emitter follower coupled transistor and a base of said second bipolar transistor, said two bipolar transistors cooperating to responsively, actively switch said prescribed signal at said output terminal between a high signal level and a low signal level in relation to corresponding input signal changes between said first value and said second value.

4. A signal switching circuit for supplying a signal having a prescribed one of two levels in response to associated transition in an input signal between a first value and a second value, said signal switching circuit being powered by a power source, said switching circuit comprising:

an output terminal supplying said prescribed signal having one of two levels;

first transistor means, including a bipolar emitter follower coupled transistor, for actively pulling-up said prescribed signal at said output terminal in response to a first predefined change in said input signal, and first transistor means having a first input for receiving said input signal and a second input for coupling to said power source;

second transistor means, including a MOSFET transistor, for actively pulling-down said prescribed signal in response to a second predefined change in said input signal; and feedback control means, including a dc-coupling, level shifting means, said feedback control means connecting said first transistor means and said second transistor means such that the status of said first transistor means controls said second transistor means, said two transistor means cooperating to responsively, actively switch said prescribed signal at said output terminal between a high signal level and a low signal level in relation to corresponding input signal changes between said first value and said second value.

5. The signal switching circuit of claim 4, further comprising a single input terminal for receiving the input signal, the first input of said first transistor means being coupled to said single input terminal such that status of said first transistor means is controlled by the input signal received at the single input terminal, said second transistor means actively pulling-down said prescribed signal at said output terminal in response to a second predefined change in said input signal received at the single input terminal.

6. A signal switching circuit for supplying a signal having a prescribed one of two levels in response to associated transitions in an input signal between a first value and a second value, said signal switching circuit being powered by a power source, said switching circuit comprising:

a single input terminal for receiving the input signal;

an output terminal supplying said prescribed signal having one of two levels;

first transistor means, including a source follower coupled transistor, for actively pulling-up said prescribed signal at said output terminal in response to a first predefined change in said input signal, said first transistor means having a first input coupled to said single input terminal for receiving said input signal and a second input for coupling to said power source, status of said first transistor means being controlled by the input signal received at said single input terminal;

second transistor means for actively pulling-down said prescribed signal at said output terminal in response to a second predefined change in said input signal received at said single input terminal; and feedback control means connecting said first transistor means and said second transistor means such that the status of said first transistor means controls said second transistor means, said two transistor means cooperating to responsively, actively switch said prescribed signal at said output terminal between a high signal level and a low signal level in relation to corresponding input signal changes between said first value and said second value at said single input terminal.

7. A signal switching circuit for supplying a signal having a prescribed one of two levels in response to associated transitions in an input signal between a first value and second value, said signal switching circuit being powered by a power source, said switching circuit comprising:

an output terminal supplying said prescribed signal having one of two levels;

first transistor means, including a bipolar emitter follower coupled transistor, for actively pulling-up said prescribed signal at said output terminal in response to a first predefined change in said input signal, said first transistor means having a first input for receiving said input signal and a second input for coupling to said power source;

second transistor means for actively pulling-down said prescribed signal in response to a second predefined change in said input signal; and feedback control means, including a feedback transistor, connecting said first transistor means and said second transistor means such that the status of said first transistor means controls said second transistor means, said feedback transistor comprising a bipolar feedback transistor having a collector tied to said power source, a base tied to a collector of said emitter follower coupled transistor, and an emitter connected to a base of said second transistor means, said two transistor means cooperating to responsively, actively switch said prescribed signal at said output terminal between a high signal level and a low signal level in relation to corresponding input signal changes between said first value and said second value.

8. An emitter coupled logic circuit comprising:

a bipolar transistor pull-up circuit having a base connected to a previous logic stage circuit, and having an emitter-collector circuit connected between a circuit output terminal and first power signal, said bipolar transistor pull-up circuit providing a first signal level to said output terminal in response to a first logic state applied to said base thereof by said previous logic state circuit; and a bipolar transistor pull-down circuit having a base connected to a feedback control circuit coupling said bipolar transistor pull-up and pull-down circuits, said bipolar transistor pull-down circuit further having a collector-emitter circuit connected between said output terminal and a second power signal, said bipolar transistor pull-down circuit providing a second signal level at said output terminal in response to a second logic state applied from said previous logic stage circuit to said base of said bipolar transistor pull-up circuit, said feedback control circuit including a dc-coupling, level shifting means connecting said collector of said bipolar transistor pull-up circuit and said base of said bipolar transistor pull-down circuit, whereby during switching of said logic stage circuit output from one of said logic states to the other of said logic states, said bipolar transistor pull-up circuit and said bipolar transistor pull-down circuit cooperate to actively switch the signal level at said output terminal to the associated one of said first signal level and said second signal level.

9. An active signal pull-down circuit for supplying an output signal having a prescribed low value, said active signal pull-down circuit to reside within a signal switching circuit including a signal pull-up circuit for supplying an output signal having a prescribed high value, said prescribed high value signal being output from said signal switching circuit in response to a first predefined transition in said input signal to said signal pull-up circuit, said active signal pull-down circuit comprising:

signal pull-down transistor means for actively pulling down the output signal of said signal switching circuit in response to a second predefined transition in said input signal to said active signal pull-up circuit;

self-biased feedback control means coupling said signal pull-down transistor means and said signal pull-up circuit for activating said pull-down transistor means upon initiation of said second predefined transition in said input signal to said signal pull-up circuit; and means for preventing saturation of said signal pull-down transistor.

10. An active signal pull-down circuit for supplying an output signal having a prescribed low value, said active signal pull-down circuit to reside within a signal switching circuit including a signal pull-up circuit for supplying an output signal having a prescribed high value, said prescribed high value signal being output from said signal switching circuit in response to a first predefined transition in said input signal to said signal pull-up circuit, said active signal pull-down circuit comprising:

signal pull-down transistor means, including a MOSFET pull-down device, for actively pulling-down the output signal of said signal switching circuit in response to a second predefined transition in said input signal to said active signal pull-up circuit; and self-biased feedback control means coupling said signal pull-down transistor means and said signal pull-up circuit for activating said pull-down transistor means upon initiation of said second predefined transition in said input signal to said signal pull-up circuit.

11. The signal switching circuit of claim 3, wherein said output terminal is connected to an emitter of said emitter follower coupled transistor and to a collector of said second bipolar transistor.

12. The signal switching circuit of claim 11, wherein an emitter of said second bipolar transistor is connected to a power sink, and wherein a first resistive means is coupled between said base of said second bipolar transistor and said power sink.

13. The signal switching circuit of claim 12, wherein a second resistive means is coupled between a collector of said emitter follower coupled transistor and said power source.

14. The signal switching circuit of claim 13, further comprising means for preventing saturation of said emitter follower coupled transistor.

15. The signal switching circuit of claim 14, wherein said saturation prevention means comprises a second diode coupled in parallel with said second resistive means between said power source and said collector of said emitter follower coupled transistor.

16. The signal switching circuit of claim 14, wherein said saturation prevention means includes a third bipolar transistor connected in diode configuration between said power source and said collector of said emitter follower coupled transistor.

17. The signal switching circuit of claim 14, wherein said emitter follower coupled transistor comprises a Schottky diode transistor, said Schottky diode providing said saturation prevention means.

18. The signal switching circuit of claim 14, further comprising third resistive means coupled between said emitter of said second bipolar transistor and said power sink for preventing saturation of said second bipolar transistor.

19. The signal switching circuit of claim 3, wherein said emitter follower coupled transistor and said second bipolar transistor comprise npn-type bipolar transistors.

20. The signal switching circuit of claim 3, wherein said emitter follower coupled transistor and said second bipolar transistor comprise pnp-type bipolar transistors.

21. The signal switching circuit of claim 4, wherein said dc-coupling level shifting means is connected between a collector of said emitter follower coupled transistor and a gate of said MOSFET transistor, and wherein an emitter of said emitter follower coupled transistor and a drain of said MOSFET transistor are connected together to form said output terminal supplying said prescribed signal.

22. The emitter coupled logic circuit of claim 1, wherein said feedback control circuit includes a dc-coupling, level shifting means connecting said collector of said bipolar transistor pull-up circuit and said base of said bipolar transistor pull-down circuit.

23. The emitter coupled logic circuit of claim 8, further comprising means for preventing saturation of said bipolar transistor pull-up circuit.

24. The emitter coupled logic circuit of claim 23, further comprising means for preventing saturation of said bipolar transistor pull-down circuit.

25. The emitter coupled logic circuit of claim 1, wherein said bipolar transistor pull-up circuit and said bipolar transistor pull-down circuit comprise npn-type transistors.

26. The emitter coupled logic circuit of claim 1, wherein said bipolar transistor pull-up circuit and said bipolar transistor pull-down circuit comprise pnp-type transistors.

27. The emitter coupled logic circuit of claim 1, wherein said feedback control circuit includes means for self-biasing said emitter coupled logic circuit.

28. The active signal pull-down circuit of claim 2, wherein said signal pull-down transistor means includes a bipolar pull-down transistor, and wherein said dc-coupled diode of said feedback control means drives a base of said bipolar pull-down transistor.

29. The active signal pull-down circuit of claim 28, wherein said prescribed low value signal is output at a collector of the bipolar pull-down transistor, and wherein an emitter of said bipolar pull-down transistor is coupled to a power sink.

30. The active signal pull-down circuit of claim 29, further comprising a first resistive means coupled between said base of said bipolar pull-down transistor and said power sink.

* * * * *

UNITED STATES PATENT AND TRADEMARK OFFICE
CERTIFICATE OF CORRECTION

PATENT NO. : 5,343,092
DATED : Aug. 30, 1994
INVENTOR(S) : Dhong et al.

It is certified that error appears in the above-indentified patent and that said Letters Patent is hereby corrected as shown below:

Column 8, lines 67 & 68 delete "predetermined" and substitute therefor --predefined--.

Signed and Sealed this

Fifteenth Day of November, 1994

Attest:

BRUCE LEHMAN

Attesting Officer          Commissioner of Patents and Trademarks